(12) United States Patent
Mogi

(10) Patent No.: US 7,781,555 B2
(45) Date of Patent: Aug. 24, 2010

(54) MICROCONTACT PRINTING STAMP

(75) Inventor: Hiroshi Mogi, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 1 day.

(21) Appl. No.: 12/190,699

(22) Filed: Aug. 13, 2008

(65) Prior Publication Data

US 2009/0062499 A1 Mar. 5, 2009

(30) Foreign Application Priority Data

Sep. 3, 2007 (JP) ............................. 2007-227336
Sep. 3, 2007 (JP) ............................. 2007-227338

(51) Int. Cl.
C08G 77/00 (2006.01)
C08G 77/04 (2006.01)
C08G 77/12 (2006.01)
C08G 77/20 (2006.01)

(52) U.S. Cl. ............................. 528/10; 528/15; 528/31; 528/32; D18/15

(58) Field of Classification Search .................... D18/15
See application file for complete search history.

(56) References Cited

U.S. PATENT DOCUMENTS

| | | | |
|---|---|---|---|
| 4,504,645 A * | 3/1985 | Melancon ..................... 528/15 |
| 5,348,684 A * | 9/1994 | Hemmerling et al. .. 252/299.61 |
| 6,303,675 B1 * | 10/2001 | Kobayashi et al. .......... 524/263 |
| 6,518,168 B1 * | 2/2003 | Clem et al. .................. 438/623 |
| 6,599,446 B1 | 7/2003 | Todt et al. |
| 2001/0051667 A1 * | 12/2001 | Hayashida et al. .......... 521/154 |
| 2002/0130444 A1 * | 9/2002 | Hougham ................... 264/519 |
| 2006/0137554 A1 | 6/2006 | Kron et al. |
| 2006/0208232 A1 * | 9/2006 | Fujihana et al. ............. 252/500 |
| 2007/0049716 A1 * | 3/2007 | Sayre .......................... 528/26 |
| 2007/0072974 A1 | 3/2007 | Kobayashi |

FOREIGN PATENT DOCUMENTS

| | | |
|---|---|---|
| EP | 0 971 000 A1 | 1/2000 |
| JP | 4-103666 A | 4/1992 |
| JP | 2000-137322 | 5/2000 |
| JP | 2002-500237 A | 1/2002 |
| JP | 2002-507240 A | 3/2002 |
| JP | 2002-327122 A | 11/2002 |
| JP | 2002-337472 | 11/2002 |
| JP | 2003-082232 A | 3/2003 |
| JP | 2005-129791 A | 5/2005 |
| JP | 2006/140493 A | 6/2006 |
| JP | 2006-225422 A | 8/2006 |
| JP | 2006-240115 A | 9/2006 |
| JP | 2007-98779 A | 4/2007 |

OTHER PUBLICATIONS

Machine-translated English-language equivalent of JP-2006-225422, 2006, 13 pages.*
Csucs et al., "Microcontact Printing of Macromolecules with Submicrometer Resolution by Means of Polyolefin Stamps", Langmuir vol. 19, (2003), pp. 6104-6109.
Glasmastar et al., "Silicone Transfer during Microcontact Printing", Langmuir vol. 19, (2003), pp. 5475-5483.
D.J. Graham et al., "Solution Assembled and Microcontact Printed Monolayers of Dodecanethiol on Gold: A Multivariate Exploration of Chemistry and Contamination," Langmuir, vol. 18, No. 5, pp. 1518-1527, 2002.
Partial European Search Report issued on Feb. 23, 2010 in corresponding European Patent Application No. 08 25 2894.
T.W. Odom et al., "Improved Pattern Transfer in Soft Lithography Using Composite Stamps," Langmuir, vol. 18, No. 13, pp. 5314-5320, 2002.
H. Schmid et al., "Siloxane Polymers for High-Resolution, High-Accuracy Soft Lithography." Macromolecules, vol. 33, No. 8, pp. 3042-3049, Apr. 18, 2000.
European Search Report issued on Jun. 29, 2010 in corresponding European Patent Application No. 08 25 2894.

* cited by examiner

Primary Examiner—Randy Gulakowski
Assistant Examiner—Robert Loewe
(74) Attorney, Agent, or Firm—Birch, Stewart, Kolasch & Birch, LLP

(57) ABSTRACT

A microcontact printing stamp is formed by curing a silicone rubber composition on a master. An addition reaction cure silicone rubber composition is used comprising (A) an organopolysiloxane containing at least two aliphatic unsaturated monovalent hydrocarbon groups, (B) an organohydrogenpolysiloxane containing at least two SiH groups, (C) an addition reaction catalyst, and (D) a reinforcing resin. The cured composition has a nonfunctional low-molecular-weight siloxane $D_3$-$D_{20}$ content of up to 200 ppm.

11 Claims, No Drawings

MICROCONTACT PRINTING STAMP

CROSS-REFERENCE TO RELATED APPLICATION

This non-provisional application claims priority under 35 U.S.C. §119(a) on Patent Application Nos. 2007-227336 and 2007-227338 filed in Japan on Sep. 3, 2007 and Sep. 3, 2007, respectively, the entire contents of which are hereby incorporated by reference.

TECHNICAL FIELD

This invention relates to silicone rubber stamps for microcontact printing, and more particularly, to silicone rubber stamps for microcontact printing which have been cured in elastomeric form and facilitate transfer of electroconductive ink or semiconductor ink to form a pattern of fine features.

As commonly used in the microcontact printing technology, the term "stamp" used herein refers to a silicone rubber material with the desired fine feature pattern which is obtained by casting a silicone rubber composition in an uncured state on a master with the negative of the desired fine feature pattern, curing the composition, and removing the cured composition from the master.

BACKGROUND ART

Silicone rubber is widely used in a variety of fields owing to its heat resistance, freeze resistance and electrical properties. In particular, the silicone rubber is regarded promising as the microcontact printing stamp material because it is fully flowable and allows for dimensional reproducible reversal from a master with the negative of the desired micro-feature pattern. Among others, liquid silicone rubber compositions of the addition reaction cure type are often used from the standpoints of dimensional reproducibility and ease of working.

Such silicone rubber compositions are generally supplied as comprising an organopolysiloxane having a high degree of polymerization and a reinforcing resin. These compositions are prepared by admixing a starting polymer with reinforcing resin and various dispersants in a mixing apparatus such as a universal mixer or kneader. Note that organopolysiloxane and reinforcing resin are electrically insulating. Silicone rubber compositions obtained by admixing them with other components and silicone rubber as the cured product thereof inevitably contain nonfunctional low-molecular-weight siloxane compounds, which can migrate to a glass, plastic or other substrate to which ink is transferred, resulting in a lowering or variation of electric conductivity of ink due to siloxane contamination.

With respect to the above discussion, reference should be made to Langmuir 19, 6104-6109 (2003) and Langmuir 19, 5475-5483 (2003).

As noted above, organopolysiloxane and reinforcing resin are electrically insulating. However, silicone rubber compositions obtained by admixing them with other components and silicone rubber as the cured product thereof can be electrostatically charged by contact with various materials, and thus adsorb air-borne dust and debris due to the electrostatic charge. Particularly in the case of microcontact printing stamp for use in printing of a fine feature pattern, this raises several problems including disturbed operation, a foreign matter in the next shot, and a failure to transfer the desired pattern.

Prior art antistatic rubber compositions use polyether antistatic agents as described in JP-A 2002-500237, and carbon black antistatic agents as described in JP-A 2002-507240 and JP-A 2002-327122. The polyether agents fail to achieve satisfactory antistatic effects at elevated temperature because they can be decomposed. The carbon black which is usually available as large particulates has a problem that reversal of a fine-feature pattern is impossible.

DISCLOSURE OF THE INVENTION

A first object of the invention is to provide a microcontact printing stamp which prevents contamination of a glass or plastic substrate (to which ink is to be transferred) with nonfunctional low-molecular-weight siloxane, and minimizes a lowering or variation of electric conductivity of ink due to siloxane contamination.

A second object is to provide an antistatic microcontact printing stamp comprising electrically insulating, antistatic silicone rubber.

The inventor has found that the first object is achieved by a silicone rubber which is obtained by curing an addition reaction cure silicone rubber composition such that the cured product contains nonfunctional low-molecular-weight siloxane compounds $D_3$-$D_{20}$ in a total content of up to 200 ppm.

The inventor has also found that the second object is achieved by a silicone rubber which is obtained by adding a certain amount of an ionic conducting antistatic agent to an addition reaction cure silicone rubber composition, followed by curing.

In one aspect, the invention provides a microcontact printing stamp comprising a cured product of an addition reaction cure silicone rubber composition containing nonfunctional low-molecular-weight siloxane compounds $D_3$ to $D_{20}$ in a total content of up to 200 ppm based on the cured product.

In another aspect, the invention provides an antistatic microcontact printing stamp comprising a cured product of an addition reaction cure silicone rubber composition comprising an ionic conducting antistatic agent.

The invention has the following advantages. Reducing the total content of nonfunctional low-molecular-weight siloxane $D_3$-$D_{20}$ to 200 ppm or below prevents contamination of a glass or plastic substrate to which ink is to be transferred, and minimizes a lowering or variation of electric conductivity of ink due to siloxane contamination. The antistatic microcontact printing stamp remains electrically insulating and antistatic.

DESCRIPTION OF THE PREFERRED EMBODIMENT

As used herein, the term "ppm" refers to parts by weight per million parts by weight.

The microcontact printing stamp in the first embodiment of the invention comprises a silicone rubber obtained by curing an addition reaction cure silicone rubber composition. In a preferred embodiment, the addition reaction cure silicone rubber composition comprises the following components (A) to (D).

The antistatic microcontact printing stamp in the second embodiment of the invention comprises a silicone rubber obtained by curing an addition reaction cure silicone rubber composition comprising an ionic conducting antistatic agent. In a preferred embodiment, the addition reaction cure silicone rubber composition comprises the following components (A) to (D) plus component (E).

The components are:

(A) an organopolysiloxane containing at least two aliphatic unsaturated monovalent hydrocarbon groups, specifically alkenyl groups, in a molecule, (B) an organohydrogenpolysiloxane containing at least two silicon-bonded hydrogen atoms (i.e., SiH groups) in a molecule, (C) an addition reaction catalyst, (D) a reinforcing resin, and (E) an ionic conducting antistatic agent.

Component A

Component (A) serving as a base polymer in the stamp material is an organopolysiloxane containing at least two, preferably at least three silicon-bonded aliphatic unsaturated monovalent hydrocarbon groups in a molecule. Any organopolysiloxane capable of forming a network structure through addition reaction may be used.

Suitable aliphatic unsaturated monovalent hydrocarbon groups include alkenyl groups of 2 to 6 carbon atoms such as vinyl, allyl, propenyl, 1-butenyl and 1-hexenyl. Inter alia, vinyl is most preferred because of ease of synthesis, fluidity of an uncured composition, and heat resistance of a cured composition.

The organopolysiloxane may contain other silicon-bonded organic groups. Suitable organic groups are substituted or unsubstituted monovalent hydrocarbon groups of 1 to 10 carbon atoms, excluding the aliphatic unsaturated monovalent hydrocarbon groups, for example, alkyl groups such as methyl, ethyl, propyl, butyl, pentyl, hexyl, octyl, decyl and dodecyl, aryl groups such as phenyl, aralkyl groups such as benzyl, 2-phenylethyl and 2-phenylpropyl, and substituted hydrocarbon groups, typically halo- or cyano-substituted groups, such as chloromethyl, chlorophenyl, 2-cyanoethyl, and 3,3,3-trifluoropropyl. Inter alia, methyl is most preferred because of ease of synthesis and a good balance of properties including mechanical strength and uncured fluidity.

The aliphatic unsaturated monovalent hydrocarbon groups may be present at the ends or intermediate positions of the organopolysiloxane molecular chain or both. The organopolysiloxane (A) which is preferred for providing the cured composition with improved mechanical properties is a linear diorganopolysiloxane in which the backbone consists of recurring diorganosiloxane units and is capped at both ends with triorganosiloxy groups, and at least aliphatic unsaturated monovalent hydrocarbon groups (like alkenyl groups) at both ends are included.

The siloxane skeleton may have a linear, branched or three-dimensional network structure. A blend of a linear diorganopolysiloxane and a branched organopolysiloxane is preferred in order that the cured composition have improved mechanical properties suitable for use as microcontact printing stamps. However, when a silicone rubber mold is used in the casting of an epoxy resin and specifically a transparent epoxy resin requiring surface smoothness, the presence of a branched organopolysiloxane is undesirable in that a silicone rubber mold may be increased in hardness or compromised in smoothness as a result of resinification of the branched organopolysiloxane. Where a blend as mentioned above is used as the organopolysiloxane (A), preferably the blend consists of 2 to 40% by weight of a branched and/or three-dimensional network organopolysiloxane consisting of $R_3SiO_{1/2}$ units, $SiO_2$ units and optionally $R_2SiO_{2/2}$ units (wherein R represents an organic group and aliphatic unsaturated monovalent hydrocarbon group as mentioned above, with at least two, preferably at least three aliphatic unsaturated monovalent hydrocarbon groups being present per molecule) and the balance of a linear diorganopolysiloxane having a backbone consisting of recurring $R_2SiO_{2/2}$ units and terminals consisting of $R_3SiO_{1/2}$ units, more specifically having aliphatic unsaturated monovalent hydrocarbon groups at both ends of its molecular chain.

To clearly distinguish component (A) from component (D) to be described later, component (A) should be a linear diorganopolysiloxane in an embodiment wherein component (D) contains alkenyl groups in a molecule.

Component (A) should preferably have a viscosity of 500 to 500,000 $mm^2/s$, and more preferably 1,000 to 100,000 $mm^2/s$ as measured at 25° C. by an Ostwald viscometer, in order that the uncured composition have a satisfactory flow and ease of working and the cured composition have an adequate elasticity.

The organopolysiloxane as component (A) may be prepared by equilibration reaction of a cyclopolysiloxane in the presence of a strong basic catalyst such as potassium hydroxide, tetraalkylammonium hydroxide or tetraalkylphosphonium hydroxide or a siliconate compound thereof, followed by neutralization and deactivation of the catalyst. Low-molecular-weight siloxane by-products formed during the process are removed, typically by heat stripping under vacuum. While the degree of removal of by-products depends on economy, most organopolysiloxane stocks are currently commercially available in such grade that the total amount of low-molecular-weight compounds having 3 to 20 silicon atoms in their molecule is several thousand to several ten thousand ppm based on the weight of the stock. It has been found that when the content of low-molecular-weight compounds in the organopolysiloxane is reduced to or below 1,000 ppm, and more specifically to or below 500 ppm, the total amount of nonfunctional low-molecular-weight siloxane compounds $D_3$ to $D_{20}$ (that is, cyclic diorganosiloxanes consisting of 3 to 20 monomeric units such as cyclic dimethylsiloxanes consisting of 3 to 20 monomeric units) becomes 200 ppm or below based on the cured silicone rubber composition. Therefore, in the first embodiment of the invention, it is recommended to tailor component (A) so as to contain nonfunctional low-molecular-weight siloxane compounds $D_3$ to $D_{20}$ in a total content of up to 1,000 ppm and more preferably up to 500 ppm.

Component B

Component (B) is an organohydrogenpolysiloxane containing at least two silicon-bonded hydrogen atoms (i.e., hydrosilyl or SiH groups) in a molecule. Component (B) serves as a crosslinker for component (A) in that the hydrosilyl groups undergo addition reaction to aliphatic unsaturated monovalent hydrocarbon groups in component (A). In order that the cured product have a network structure, the number of silicon-bonded hydrogen atoms participating in the addition reaction is at least 2 (specifically 2 to about 300), and preferably at least 3 (specifically 3 to about 200).

Organic groups attached to silicon atoms in the siloxane units are exemplified by the same as the organic groups other than the aliphatic unsaturated monovalent hydrocarbon groups described in conjunction with component (A). Inter alia, methyl is most preferred for ease of synthesis.

The organohydrogenpolysiloxane has a siloxane skeleton which may be linear, branched, cyclic or three-dimensional network. While a mixture of such structures may be used, a linear one is preferred.

For component (B), the degree of polymerization (or the number of silicon atoms per molecule) is not particularly limited. However, since an organohydrogenpolysiloxane having at least two hydrogen atoms bonded to a common silicon atom is difficult to synthesize, those organohydrogenpolysiloxanes including at least three siloxane units are preferred (for example, the number of silicon atoms per molecule is 3 to about 300, preferably 4 to about 200). The organohydrogenpolysiloxane should preferably have a viscosity of 15 to 200 mm²/s as measured at 25° C. by an Ostwald viscometer, for ease of handling and no volatilization during shelf storage and during heating for cure reaction.

Component (B) is compounded in such amounts to provide 0.5 to 5, preferably 1 to 3 silicon-bonded hydrogen atoms per aliphatic unsaturated monovalent hydrocarbon group in component (A). Smaller amounts to provide a hydrogen atom/unsaturated group ratio of less than 0.5 are undesired in that the cure reaction is not completed so that a cured product of the composition becomes tacky and hence, poor in parting property when a microcontact printing stamp is formed on a master having the negative of the desired fine pattern. Inversely, larger amounts to provide a hydrogen atom/unsaturated group ratio of more than 5 may lead to an increased occasion of foaming upon curing. Such foams may accumulate at the interface when a microcontact printing stamp is formed on a master having the negative of the desired fine pattern, inhibiting reversal of the desired fine pattern.

Component C

Component (C) is an addition reaction catalyst which is typically selected from platinum compounds. Platinum compounds serve as a catalyst for promoting addition reaction between aliphatic unsaturated monovalent hydrocarbon groups in component (A) and hydrosilyl groups in component (B) and exhibit catalysis for curing reaction around room temperature.

Examples of suitable platinum compounds include chloroplatinic acid, complexes obtained through reaction of chloroplatinic acid with alcohols, platinum-olefin complexes, platinum-vinyl siloxane complexes, platinum-ketone complexes, and platinum-aldehyde complexes. Of these, the reaction products of chloroplatinic acid with alcohols and platinum-vinyl siloxane complexes are preferred for solubility in components (A) and (B) and catalytic activity.

Component (C) is compounded in such amounts as to provide 1 to 100 ppm, and preferably 2 to 50 ppm of platinum atom based on the weight of component (A). Less than 1 ppm may lead to a low cure speed, at which the cure reaction may not be completed so that a silicone rubber mold may become tacky and hence, poor in parting property when it is parted from a master, and poor in parting property when replicas are parted from it. More than 100 ppm may lead to an extremely high cure speed that may hinder working after the components are combined together, and be uneconomical.

Component D

Component (D) is a reinforcing resin for endowing the cured composition with mechanical properties (typically strength). Preferred are organopolysiloxane resins of three-dimensional network structure containing siloxane units of $R^1{}_3SiO_{1/2}$ and siloxane units of $SiO_{4/2}$ and optionally containing alkenyl groups, wherein $R^1$ is independently a substituted or unsubstituted monovalent hydrocarbon group.

Suitable substituted or unsubstituted monovalent hydrocarbon group represented by $R^1$ are exemplified by the same as the aliphatic unsaturated monovalent hydrocarbon groups and the organic groups other than the aliphatic unsaturated monovalent hydrocarbon groups described in conjunction with component (A).

It is preferred for mechanical properties of the cured composition that $R^1{}_3SiO_{1/2}$ units and $SiO_{4/2}$ units be contained such that a molar ratio of $R^1{}_3SiO_{1/2}/SiO_{4/2}$ is from 0.3 to 2, and more preferably from 0.7 to 1. If necessary, the reinforcing resin may contain $R^1{}_2SiO$ units and $R^1SiO_{3/2}$ units each in a proportion of 0 to 10 mol %, and preferably 0 to 5 mol % of the reinforcing resin wherein $R^1$ is as defined above.

Component (D) is specifically compounded in an amount of 5 to 100 parts, more specifically 10 to 60 parts, and even more specifically 10 to 50 parts by weight per 100 parts by weight of component (A), because the microcontact printing stamp obtained by curing of such a composition is endowed with mechanical properties (typically strength).

The resin as component (D) may be prepared by equilibration reaction of a cyclopolysiloxane in the presence of a strong basic catalyst such as potassium hydroxide, tetraalkylammonium hydroxide or tetraalkylphosphonium hydroxide or a siliconate compound thereof, followed by neutralization and deactivation of the catalyst. Low-molecular-weight siloxane by-products formed during the process are removed, typically by heat stripping under vacuum. While the degree of removal of by-products depends on economy, most resin stocks are currently commercially available in such grade that the total amount of low-molecular-weight compounds having 3 to 20 silicon atoms in their molecule is several thousand to several ten thousand ppm based on the weight of the stock. It has been found that when the content of low-molecular-weight compounds in the resin is reduced to or below 1,000 ppm, and more specifically to or below 500 ppm, the total amount of nonfunctional low-molecular-weight siloxane compounds $D_3$ to $D_{20}$ becomes 200 ppm or below based on the cured silicone rubber composition. Therefore, in the first embodiment of the invention, it is recommended to tailor component (D) so as to contain nonfunctional low-molecular-weight siloxane compounds $D_3$ to $D_{20}$ in a total content of up to 1,000 ppm and more preferably up to 500 ppm.

In the silicone rubber composition of the addition reaction cure type of the invention, any other components may be compounded for a particular purpose as long as the objects of the invention are not compromised. For example, cure retarders such as acetylene compounds, diallyl maleate, triallyl isocyanurate, nitrile compounds and organic peroxides may be compounded for prolonging the cure time of the silicone rubber composition at room temperature for facilitating working. Additionally, parting agents, pigments, plasticizers, flame retardants, thixotropic agents, fungicidal agents, mildew-proof agents or the like may be compounded, if desired.

The silicone rubber composition in the first embodiment may be prepared by intimately mixing components (A) to (D) and optional components on a mixing apparatus such as a planetary mixer, Shinagawa mixer, universal mixer or kneader. Most often, the composition is prepared in a two pack system, one pack including component (B) and the other pack including component (C), which are separately stored and intimately mixed together immediately before use. Alternatively, all the components may be stored in a common container in the presence of a cure retarder.

The microcontact printing stamp of the first embodiment is prepared by feeding the silicone rubber composition described above on a master with the negative of the desired fine pattern, curing the composition in place, and removing the cured silicone rubber composition (i.e., silicone rubber) having the desired fine pattern transferred by reversal. Although the conditions under which the silicone rubber composition is cured are not particularly limited, it may be cured by heating at a relatively low temperature, typically from room temperature (25° C.) to about 100° C. Preferably, it is cured by heating at 120 to 200° C., and more preferably 150 to 180° C. for about 0.5 to 2 hours, more preferably about 1 to 2 hours.

The microcontact printing stamp in the first embodiment comprises a cured product of the above-described silicone rubber composition which contains nonfunctional low-molecular-weight siloxane compounds $D_3$ to $D_{20}$ (organocyclosiloxanes having 3 to 20 silicon atoms) in a total content of up to 200 ppm (i.e., 0 to 200 ppm), more specifically up to 150 ppm (i.e., 0 to 150 ppm), based on the cured product. Such a cured product with a nonfunctional low-molecular-weight siloxane content of up to 200 ppm may be achieved by using components (A) and (D) each having a content of nonfunctional low-molecular-weight siloxane $D_3$-$D_{20}$ reduced to 1,000 ppm or below, more specifically 500 ppm or below.

The method of reducing the content of nonfunctional low-molecular-weight siloxane $D_3$-$D_{20}$ in component (A) or (D) to the above-described range includes solvent extraction, vacuum stripping, thin-film evaporation or a combination of two or more of the foregoing. As used herein, the term "nonfunctional" means that silicon-bonded organic groups are non-reactive. For example, alkyl, aryl and aralkyl groups are encompassed. The term does not encompass alkenyl groups which are addition reactive.

The content of nonfunctional low-molecular-weight siloxanes is determined by cutting a mass of about 2 mm$^3$ from the silicone rubber (addition reaction cured silicone rubber composition), immersing the mass in acetone for 16 hours for extraction, and analyzing the acetone solvent by FID gas chromatography.

Component E

The silicone rubber composition in the second embodiment of the invention is a silicone rubber composition of the addition reaction cure type comprising components (A) to (D) as defined above and additionally component (E), ionic conducting antistatic agent.

Component (E) or ionic conducting antistatic agent in the silicone rubber composition (of which the antistatic microcontact printing stamp is fabricated) is not particularly limited as long as it is an ionic conducting substance rather than an electronic conducting substance like carbon black. Lithium salts are preferred.

Examples of the ionic conducting antistatic agent include $LiBF_4$, $LiClO_4$, $LiPF_6$, $LiAsF_6$, $LiSbF_6$, $LiSO_3CF_3$, $LiN(SO_2CF_3)_2$, $LiSO_3C_4F_9$, $LiC(SO_2CF_3)_3$, and $LiB(C_6H_5)_4$, and the like. These agents may be used alone or in admixture.

The ionic conducting antistatic agent may be added specifically in an amount of 0.0001 to 5 parts, more specifically 0.0005 to 3 parts, even more specifically 0.001 to 1 part, and further specifically 0.001 to 0.5 part by weight per 100 parts by weight of component (A). Less than 0.0001 pbw of the agent may achieve less antistatic effects whereas more than 5 pbw may prevent the silicone rubber from maintaining insulation or may adversely affect the physical properties and heat resistance of the silicone rubber.

In the silicone rubber composition of the addition reaction cure type according to the second embodiment of the invention, any other components may also be compounded for a particular purpose as long as the objects of the invention are not compromised. Such other components are the same as described in the first embodiment.

The silicone rubber composition in the second embodiment may be prepared, as in the first embodiment, by intimately mixing components (A) to (E) and optional components on a mixing apparatus such as a planetary mixer, Shinagawa mixer, universal mixer or kneader.

The microcontact printing stamp of the second embodiment is prepared by feeding the silicone rubber composition described above on a master with the negative of the desired fine pattern, curing the composition in place, and removing the cured silicone rubber composition (i.e., silicone rubber) having the desired fine pattern transferred by reversal. The conditions under which the silicone rubber composition is cured are the same as in the first embodiment.

Specifically, the cured product has a volume resistivity of at least 1 GΩ-m and more specifically at least 2 GΩ-m, with which a practically acceptable insulating level is achievable.

The antistatic effect is preferably such that when a corona discharge is applied to a silicone rubber molding to establish a static charge of 6 kV on its surface, the time passed until the charged voltage decreases to one-half is within 2 minutes, more specifically within 1 minute. Measurement is made by a Static Honestmeter (Shishido Electrostatic, Ltd.), for example.

EXAMPLE

Examples of the invention are given below by way of illustration and not by way of limitation. All parts are by weight. Me is methyl and Vi is vinyl. The term "end-capped" means that a siloxane is capped with the indicated groups at both ends of its molecular chain. The viscosity is as measured at 25° C. by an Ostwald viscometer.

A charge of static electricity was determined by using a Static Honestmeter (Shishido Electrostatic, Ltd.), applying a corona discharge to a silicone rubber molding to establish a static electricity charge of 6 kV on its surface, and measuring the time passed until the charged voltage decreased to one-half. A volume resistivity was measured according to JIS K-6249.

Example 1

A silicone compound #1 was prepared by mixing the following components on a planetary mixer at room temperature for one hour: 100 parts of a linear dimethylpolysiloxane composed of intermediate units (backbone recurring units) of dimethylsiloxane units, end-capped with dimethylvinylsiloxy groups, and having a viscosity of 5,000 mm$^2$/s in which the content of nonfunctional low-molecular-weight siloxane $D_3$-$D_{20}$ had been reduced to 350 ppm by vacuum stripping, and 40 parts of a vinyl-containing methylpolysiloxane resin consisting of $Vi(Me)_2SiO_{1/2}$ units and $SiO_{4/2}$ units in a molar ratio of 0.8:1 and having a viscosity of 5,000 mm$^2$/s in which the content of nonfunctional low-molecular-weight siloxane $D_3$-$D_{20}$ had been reduced to 450 ppm by vacuum stripping.

A curing agent #1 was prepared by intimately mixing the following components: 100 parts of a dimethylvinylsiloxy-endcapped dimethylpolysiloxane (vinyl content 0.2 wt %) having a viscosity of 1,000 mm$^2$/s, (B) 3 parts of a trimethylsiloxy-endcapped methylhydrogenpolysiloxane (SiH content 1.5 wt %) having a viscosity of 30 mm$^2$/s, and (C) 0.3 part (providing 5 ppm of platinum metal based on the final composition) of a microparticulate catalyst obtained by dispersing a complex of chloroplatinic acid with vinylsiloxane in a thermoplastic silicone resin with a softening point of 80-90° C., followed by atomization.

Silicone compound #1 and curing agent #1 were mixed in a weight ratio of 100:10 to form a silicone rubber composition, which was sheeted and cured at 150° C. for one hour into a sheet of 2 mm thick. The nonfunctional low-molecularweight siloxane content of this silicone rubber was determined by FID gas chromatography. The results are shown in Table 1.

Comparative Example 1

A silicone compound #2 was prepared by mixing the following components on a planetary mixer at room temperature for one hour: 100 parts of a linear dimethylpolysiloxane composed of intermediate units of dimethylsiloxane units, end-capped with dimethylvinylsiloxy groups, and having a viscosity of 5,000 mm$^2$/s in which the content of nonfunctional low-molecular-weight siloxane $D_3$-$D_{20}$ was 12,000 ppm, and 40 parts of a vinyl-containing methylpolysiloxane resin consisting of Vi(Me)$_2$SiO$_{1/2}$ units and SiO$_{4/2}$ units and having a viscosity of 5,000 mm$^2$/s in which the content of nonfunctional low-molecular-weight siloxane $D_3$-$D_{20}$ was 30,000 ppm.

Aside from using silicone compound #2, a silicone rubber was prepared as in Example 1. The nonfunctional low-molecular-weight siloxane content of the silicone rubber was determined by FID gas chromatography. The results are shown in Table 1.

A microcontact printing stamp was formed by curing each addition reaction cure silicone rubber composition on a silicon wafer having the negative of a 5-μm line-and-space pattern. Using the stamp, the pattern of a silver ink was printed on a polyethylene terephthalate (PET) film. The print quality was observed under a microscope.

TABLE 1

|  | Example 1 | Comparative Example 1 |
|---|---|---|
| Nonfunctional low-molecular-weight siloxane $D_3$-$D_{20}$ content (ppm) | 130 | 9,500 |
| PET film contamination | Nil | Contaminated |
| Silver ink pattern | Good | Cissings, breaks |

Example 2

A silicone compound #3 was prepared by mixing the following components on a planetary mixer at room temperature for one hour: 100 parts of a linear dimethylpolysiloxane composed of intermediate units (backbone recurring units) of dimethylsiloxane units and end-capped with dimethylvinylsiloxy groups, and having a viscosity of 5,000 mm$^2$/s, and 40 parts of a vinyl-containing methylpolysiloxane resin consisting of Vi(Me)$_2$SiO$_{1/2}$ units and SiO$_{4/2}$ units in a molar ratio of 0.8:1 and having a viscosity of 5,000 mm$^2$/s. To 100 parts of the mixture was added 0.05 part of adipic ester containing 20 wt % of LiN(SO$_2$CF$_3$)$_2$ as an antistatic agent. Mixing completed silicone compound #3.

A curing agent #2 was prepared by intimately mixing 100 parts of a dimethylvinylsiloxy-endcapped dimethylpolysiloxane (vinyl content 0.2 wt %) and having a viscosity of 1,000 mm$^2$/s with (B) 3 parts of a trimethylsiloxy-endcapped methylhydrogenpolysiloxane (SiH content 1.5 wt %) having a viscosity of 30 mm$^2$/s and (C) 0.3 part (providing 5 ppm of platinum metal based on the final composition) of a microparticulate catalyst obtained by dispersing a complex of chloroplatinic acid with vinylsiloxane in a thermoplastic silicone resin with a softening point of 80-90° C., followed by atomization.

Silicone compound #3 and curing agent #2 were mixed in a weight ratio of 100:10 to form a silicone rubber composition, which was sheeted and cured at 150° C. for one hour into a sheet of 2 mm thick. The silicone rubber was measured for electrostatic charge (half-life) and volume resistivity. The results are shown in Table 2.

Example 3

A silicone rubber was manufactured as in Example 2 except that 0.01 part of the antistatic agent was added. The silicone rubber was measured for electrostatic charge (half-life) and volume resistivity. The results are also shown in Table 2.

Comparative Example 2

A silicone rubber was manufactured as in Example 2 except that the antistatic agent was omitted. The silicone rubber was measured for electrostatic charge (half-life) and volume resistivity. The results are also shown in Table 2.

Comparative Example 3

A silicone rubber was manufactured as in Example 2 except that a polyether-modified silicone fluid having a viscosity of 75 mm$^2$/s at 25° C. (KF351F by Shin-Etsu Chemical Co., Ltd.) was used instead of the antistatic agent. The silicone rubber was measured for electrostatic charge (half-life) and volume resistivity. The results are also shown in Table 2.

A microcontact printing stamp having a 5-μm line-and-space pattern was formed by curing each silicone rubber composition on a master. The stamp was visually observed to see whether dust and debris adsorbed to the stamp. Using the stamp, the pattern of a silver ink was printed on a PET film. The print quality was observed under a microscope.

TABLE 2

|  | Example | | Comparative Example | |
|---|---|---|---|---|
|  | 2 | 3 | 2 | 3 |
| Half-life from 6 kV | 1 sec | 1 sec | 240 sec | 250 sec |
| Volume resistivity (Ω-m) | $2.0 \times 10^{12}$ | $1.5 \times 10^{12}$ | $2.0 \times 10^{12}$ | $1.3 \times 10^{12}$ |
| Adsorbed dust and debris | Nil | Nil | Found | Found |
| Silver ink pattern | Good | Good | Some breaks | Breaks |

Japanese Patent Application Nos. 2007-227336 and 2007-227338 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A microcontact printing stamp comprising a cured product of an addition reaction cure silicone rubber composition containing nonfunctional low-molecular-weight siloxane compounds $D_3$ to $D_{20}$ in a total content of up to 200 ppm based on the cured product, wherein
   the addition reaction cure silicone rubber composition comprises:
   (A) a linear diorganopolysiloxane containing at least two aliphatic unsaturated monovalent hydrocarbon groups in a molecule;
   (B) an organohydrogenpolysiloxane containing at least two silicon-bonded hydrogen atoms in a molecule;

(C) an addition reaction catalyst; and (D) an organopolysiloxane resin of three-dimensional network structure containing siloxane units of $R^1_3SiO_{1/2}$ and siloxane units of $SiO_{4/2}$, wherein the molar ratio of $R^1_3SiO_{1/2}$ units to $SiO_{4/2}$ units is from 0.3 to 2, and wherein $R^1$ is independently a substituted or unsubstituted monovalent hydrocarbon group, in an amount of 5 to 100 parts by weight per 100 parts by weight of component (A).

2. The microcontact printing stamp of claim 1, wherein the amount of component (D) is 10 to 60 parts by weight per 100 parts by weight of the component (A).

3. An antistatic microcontact printing stamp comprising a cured product of an addition reaction cure silicone rubber composition comprising, wherein
the addition reaction cure silicone rubber composition comprises:
(A) a linear diorganopolysiloxane containing at least two aliphatic unsaturated monovalent hydrocarbon groups in a molecule;
(B) an organohydrogenpolysiloxane containing at least two silicon-bonded hydrogen atoms in a molecule;
(C) an addition reaction catalyst;
(D) an organopolysiloxane resin of three-dimensional network structure containing siloxane units of $R^1_3SiO_{1/2}$ and siloxane units of $SiO_{4/2}$, wherein the molar ratio of $R^1_3SiO_{1/2}$ units to $SiO_{4/2}$ units is from 0.3 to 2, and wherein $R^1$ is independently a substituted or unsubstituted monovalent hydrocarbon group, in an amount of 5 to 100 parts by weight per 100 parts by weight of component (A); and
(E) an ionic conducting antistatic agent.

4. The antistatic microcontact printing stamp of claim 3, wherein the ionic conducting antistatic agent (E) is a lithium salt.

5. The antistatic microcontact printing stamp of claim 4, wherein the ionic conducting antistatic agent (E) is selected from the group consisting of $LiBF_4$, $LiClO_4$, $LiPF_6$, $LiAsF_6$, $LiSbF_6$, $LiSO_3CF_3$, $LiN(SO_2CF_3)_2$, $LiSO_3C_4F_9$, $LiC(SO_2CF_3)_3$, $LiB(C_6H_5)_4$, and mixtures thereof.

6. The antistatic microcontact printing stamp of claim 3, wherein the cured product has a volume resistivity of at least 1 GΩ-m.

7. The antistatic microcontact printing stamp of claim 3, wherein the amount of component (D) is 10 to 60 parts by weight per 100 parts by weight of the component (A).

8. A microcontact printing stamp comprising a cured product of an addition reaction cure silicone rubber composition containing nonfunctional low-molecular-weight siloxane compounds $D_3$ to $D_{20}$ in a total content of up to 200 ppm based on the cured product,
wherein the addition reaction cure silicone rubber composition consists essentially of:
(A) a linear diorganopolysiloxane containing at least two aliphatic unsaturated monovalent hydrocarbon groups in a molecule;
(B) an organohydrogenpolysiloxane containing at least two silicon-bonded hydrogen atoms in a molecule;
(C) an addition reaction catalyst; and
(D) an organopolysiloxane resin of three-dimensional network structure containing siloxane units of $R^1_3SiO_{1/2}$ and siloxane units of $SiO_{4/2}$, wherein the molar ratio of $R^1_3SiO_{1/2}$ units to $SiO_{4/2}$ units is from 0.3 to 2, and wherein $R^1$ is independently a substituted or unsubstituted monovalent hydrocarbon group, in an amount of 5 to 100 parts by weight per 100 parts by weight of component (A).

9. An antistatic microcontact printing stamp comprising a cured product of an addition reaction cure silicone rubber composition, wherein
the addition reaction cure silicone rubber composition consists essentially of:
(A) a linear diorganopolysiloxane containing at least two aliphatic unsaturated monovalent hydrocarbon groups in a molecule;
(B) an organohydrogenpolysiloxane containing at least two silicon-bonded hydrogen atoms in a molecule;
(C) an addition reaction catalyst;
(D) an organopolysiloxane resin of three-dimensional network structure containing siloxane units of $R^1_3SiO_{1/2}$ and siloxane units of $SiO_{4/2}$, wherein the molar ratio of $R^1_3SiO_{1/2}$ units to $SiO_{4/2}$ units is from 0.3 to 2, and wherein $R^1$ is independently a substituted or unsubstituted monovalent hydrocarbon group, in an amount of 5 to 100 parts by weight per 100 parts by weight of component (A); and
(E) an ionic conducting antistatic agent.

10. The antistatic microcontact printing stamp of claim 9, wherein the ionic conducting antistatic agent (E) is a lithium salt.

11. The antistatic microcontact printing stamp of claim 10, wherein the ionic conducting antistatic agent (E) is selected from the group consisting of $LiBF_4$, $LiClO_4$, $LiPF_6$, $LiAsF_6$, $LiSbF_6$, $LiSO_3CF_3$, $LiN(SO_2CF_3)_2$, $LiSO_3C_4F_9$, $LiC(SO_2CF_3)_3$, $LiB(C_6H_5)_4$, and mixtures thereof.

* * * * *